United States Patent
Herman

Patent Number: 5,777,496
Date of Patent: Jul. 7, 1998

[54] CIRCUIT FOR PREVENTING MORE THAN ONE TRANSISTOR FROM CONDUCTING

[75] Inventor: Jerard I. Herman, Nashua, N.H.

[73] Assignee: AEG Schneider Automation, Inc., No. Andover, Mass.

[21] Appl. No.: 622,744

[22] Filed: Mar. 27, 1996

[51] Int. Cl.$^6$ .................................................. H03B 1/00
[52] U.S. Cl. .............................. 327/108; 327/72; 327/112
[58] Field of Search .............................. 327/72, 73, 77, 327/108, 109, 110, 111, 112

[56] References Cited

U.S. PATENT DOCUMENTS

| | | | |
|---|---|---|---|
| 3,448,396 | 6/1969 | Conant | 330/24 |
| 4,603,268 | 7/1986 | Davis | 307/559 |
| 4,703,407 | 10/1987 | Fry et al. | 363/16 |
| 4,845,386 | 7/1989 | Ueno | 307/446 |
| 4,910,416 | 3/1990 | Salcone | 307/254 |
| 4,972,104 | 11/1990 | Estrada | 307/456 |
| 5,023,481 | 6/1991 | Tero et al. | 307/456 |
| 5,099,138 | 3/1992 | Fukunaga | 327/109 |
| 5,153,464 | 10/1992 | Joly | 307/473 |
| 5,204,563 | 4/1993 | Jason | 307/585 |
| 5,281,862 | 1/1994 | Ma | 307/270 |
| 5,285,170 | 2/1994 | Stockstad et al. | 330/255 |
| 5,296,758 | 3/1994 | Sandhu | 307/443 |
| 5,309,042 | 5/1994 | Joly | 307/446 |
| 5,341,338 | 8/1994 | Hashiguchi et al. | 327/108 |
| 5,365,118 | 11/1994 | Wilcox | 327/109 |
| 5,371,423 | 12/1994 | Berthold et al. | 326/57 |
| 5,396,108 | 3/1995 | McClure | 327/108 |
| 5,404,051 | 4/1995 | Kobayashi | 327/170 |
| 5,408,150 | 4/1995 | Wilcox | 327/108 |
| 5,541,541 | 7/1996 | Salamina et al. | 327/108 |
| 5,565,715 | 10/1996 | Doluca | 327/108 |
| 5,606,281 | 2/1997 | Gloaguen | 327/108 |
| 5,608,346 | 3/1997 | Giebel | 327/108 |

*Primary Examiner*—Timothy P. Callahan
*Assistant Examiner*—Jeffrey Zweizig
*Attorney, Agent, or Firm*—Ware, Fressola, Van Der Sluys & Adolphson, LLP

[57] ABSTRACT

A totem pole output stage including first and second control modules cross coupled to first and second switching modules for measuring the charge on the gate of a FET contained in the opposing switching module to determine the condition of the opposing switching module, so as to avoid mutual conductivity events without the use of a fixed timing delay while maximizing switching performance.

8 Claims, 5 Drawing Sheets

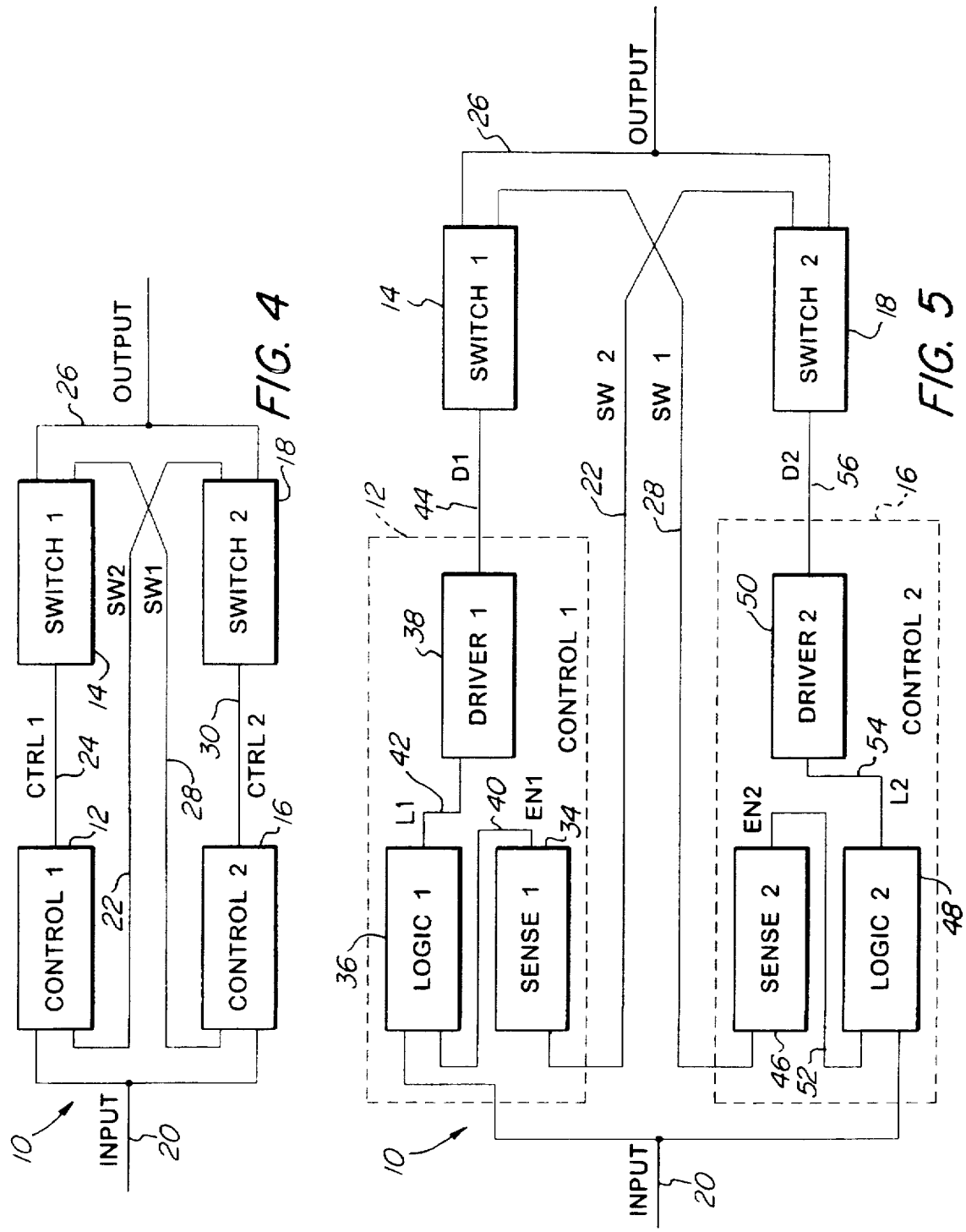

5,777,496

CIRCUIT FOR PREVENTING MORE THAN ONE TRANSISTOR FROM CONDUCTING

BACKGROUND OF THE INVENTION

1. Field of the Invention

The present invention relates to a totem pole output stage and more particularly, to a totem pole output stage which protects against mutual conductivity events without the use of a fixed timing delay circuit while providing maximum switching performance.

2. Description of the Prior Art

Conventional totem pole output stages are susceptible to mutual conductivity events if both output transistors conduct at the same time. Current spikes from the positive voltage supply to ground through the conducting pull-up and pull-down transistors can result in excessive power losses at high switching frequencies, excessive noise and adverse thermal effects.

To avoid mutual conductivity events, totem pole output stages have traditionally incorporated a fixed time delay (deadband) to ensure that both transistors are not turned on simultaneously. FIG. 1 illustrates a typical totem pole output stage arrangement having two input signals (A, B) and an output signal (Output) located between the two output switching transistors ($T_1$, $T_2$) which are arranged in series between voltage levels +V and −V. The input signals (A, B) are applied to the transistors ($T_1$, $T_2$) via time delay functions ($D_1$, $D_2$), respectively. The timing diagram of FIG. 2 shows a typical timing strategy used with the circuit of FIG. 1 including deadband times (time delays) to prevent both transistors from conducting at the same time. The deadband times are determined by the time delay functions ($D_1$, $D_2$) and are based upon the maximum amount of time necessary for the transistor that is ON to be turned OFF and stop conducting. Of course the deadband times must account for the storage time delay in the switching transistors since current continues to flow after a transistor is turned OFF. Moreover, switch characteristics can change, possibly lengthening the delay required. Unfortunately, worst case designs for time delay can result in exaggerated turn-on delays when the storage time is at a minimum, limiting the bandwidth of the input signal. Moreover, since time delay circuits are typically implemented with no feedback, a component failure may result in both transistors conducting simultaneously.

Consequently, a totem pole output stage which protects against mutual conductivity events without the use of a fixed timing delay while providing a minimum switching time is highly desirable.

SUMMARY OF THE INVENTION

The present invention is designed to overcome the limitations inherent in the various totem pole output stage configurations discussed above and toward this end it includes a totem pole output stage which protects against mutual conductivity events without the use of a fixed timing delay while providing maximum switching performance.

The totem pole output stage of the present invention includes first and second control modules, cross-coupled to first and second switching modules, so that each control module can measure the residual charge of an output switching transistor contained in the opposing switching module to determine the condition of the opposing switching module. The continuous measurement by each control module of the state of the opposing switching module allows the stage to avoid mutual conductivity events and operate without the use of a fixed time delay, thereby minimizing the switching time.

Other advantages will become apparent to those skilled in the art from the following detailed description read in conjunction with the appended claims and drawings attached hereto.

BRIEF DESCRIPTION OF THE DRAWINGS

For a fuller understanding of the present invention, reference is made to the following detailed description taken in connection with the accompanying drawings, in which:

FIG. 4 is a simplified schematic block diagram of a totem pole output stage embodying the principles of the present invention;

FIG. 5 is a detailed schematic block diagram of the simplified block diagram of FIG. 4;

BEST MODE FOR CARRYING OUT THE INVENTION

Figure 2:
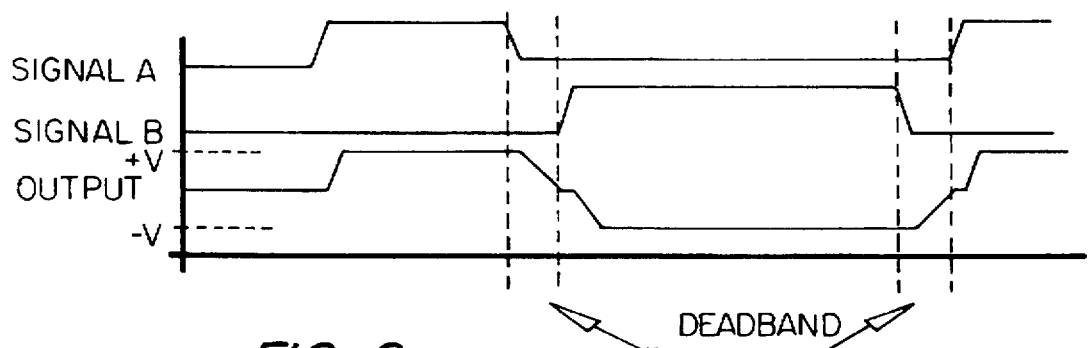
FIG. 2 is a timing diagram illustrating a typical timing strategy used with the prior art totem pole output stage of FIG. 1.
Figure 1:
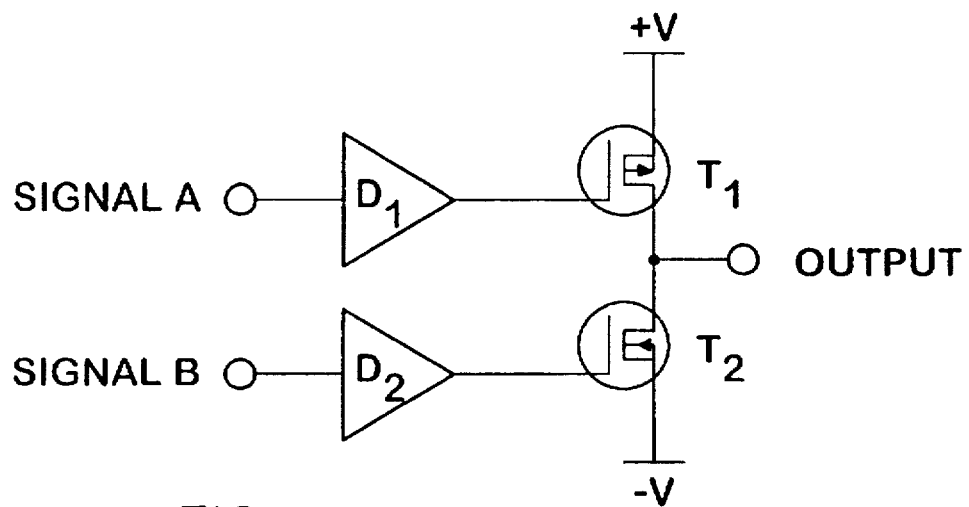
FIG. 1 is a prior art totem pole output stage.
Figure 3:
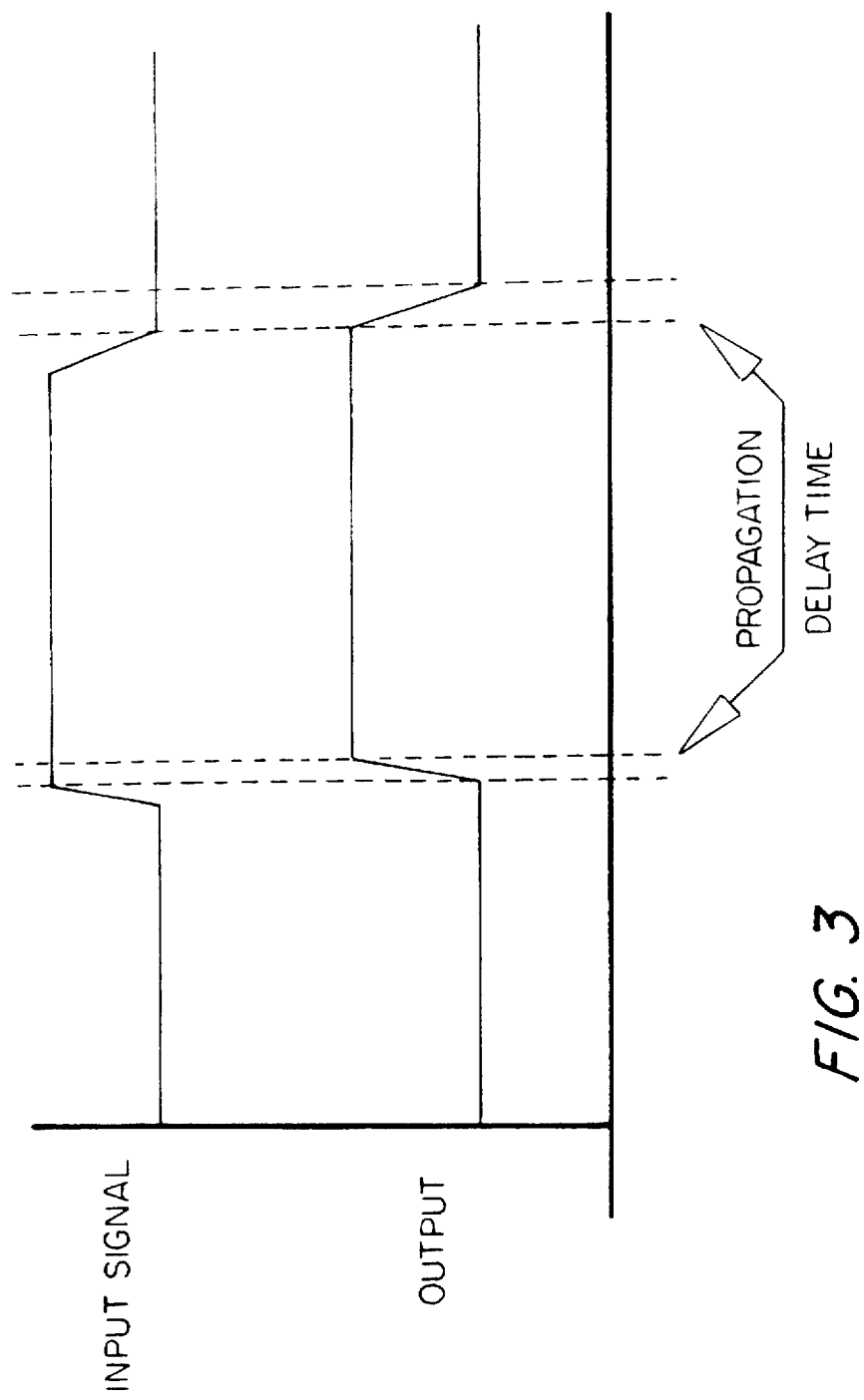
FIG. 3 is a timing diagram illustrating the propagation delay associated with the totem pole output stage of the present invention.

The totem pole output stage of the present invention provides a continuous measurement of the status of output switching transistors to allow the output stage to avoid mutual conductivity events without the use of a fixed timing delay as illustrated in the timing diagram of FIG. 3.

Referring to FIG. 4, there is illustrated a totem pole output stage of the present invention, generally indicated by the numeral 10. The stage 10 includes a first control module (CONTROL1) 12, a first switch module (SWITCH1) 14, a second control module (CONTROL2) 16 and a second switch module (SWITCH2) 18.

The first control module (CONTROL1) 12 is responsive to an input signal (INPUT) on line 20 and a second switch status signal (SW2) provided from the second switch module (SWITCH2) 18 on line 22 for providing a first control signal (CTRL1) on line 24 to the first switch module (SWITCH1) 14.

The first switch module (SWITCH1) 14 is responsive to the first control signal (CTRL1) on line 24 for providing an output signal (OUTPUT) on line 26 and a first switch status signal (SW1) on line 28.

The second control module (CONTROL2) 16 is responsive to the input signal (INPUT) on line 20 and the first switch status signal (SW1) on line 28 for providing a second control signal (CTRL2) on line 30 to the second switch module (SWITCH2) 18.

The second switch module (SWITCH2) 18 is responsive to the second control signal (CTRL2) on line 30 for providing both the output signal (OUTPUT) on line 26 and the second switch status signal (SW2) on line 22.

The first and second switch status signals (SW1, SW2) 28, 22 indicate whether the first and second switch modules (SWITCH1, SWITCH2) 14, 18 respectively, are in a conducting or nonconducting state by measuring the charge on the gate of a FET (FIG. 6) contained within the first and second switch modules (SWITCH1, SWITCH2) 14, 18. This information is used by the first and second control modules (CONTROL1, CONTROL2) 12, 16 to control the state of their respective switches (SWITCH1) 14, (SWITCH2) 18 to avoid a mutually conductive state without the use of a fixed timing delay while maximizing switching performance.

As shown in the detailed block diagram of FIG. 5, the first control module (CONTROL1) 12 includes a first sensing module (SENSE1) 34, a first logic module (LOGIC1) 36 and a first driver module (DRIVER1) 38. The first sensing module (SENSE1) 34 is responsive to the second switch status signal (SW2) on line 22 and provides a first enable signal (EN1) on line 40 to the first logic module (LOGIC1) 36. More specifically, the first sensing module (SENSE1) 34 senses the charge on the gate of the FET (FIG. 6) contained within the second switch module (SWITCH2) 18 to determine whether the FET is conducting. If the FET is conducting, then EN1 is logic LOW. However, once the first sensing module (SENSE1) 34 senses that the FET has turned OFF and is no longer conducting, then EN1 is logic HIGH, indicating that it is safe to turn the FET contained in the first switch module (SWITCH1) 14 ON.

The first logic module (LOGIC1) 36 is responsive to the input signal (INPUT) on line 20 and the first enable signal (EN1) on line 40 from the first sensing module (SENSE1) 34 for providing a first logic signal (L1) on line 42 to the first driver module (DRIVER1) 38. More specifically, LOGIC1 36 enables L1 only when both inputs INPUT and EN1 are logic HIGHs, ensuring that the FET (FIG. 6) in the second switch module (SWITCH2) 18 is no longer conducting.

The first driver module (DRIVER1) 38 is responsive to the first logic signal (L1) on line 42 and provides a first driver signal (D1) on line 44 to the first switch module (SWITCH1) 14. The first driver module (DRIVER1) 38 drives the FET contained in the first switch module (SWITCH1) 14 when L1 is a logic HIGH.

The second control module (CONTROL2) 16 contains elements which are similar to those contained in the first control module (CONTROL1) 12. Specifically, the second control module (CONTROL2) 16 includes a second sensing module (SENSE2) 46, a second logic module (LOGIC2) 48 and a second driver module (DRIVER2) 50. The second sensing module (SENSE2) 46 is responsive to the first switch status signal (SW1) on line 28 and provides a second enable signal (EN2) on line 52 to the second logic module (LOGIC2) 48. Similar to the first sensing module (SENSE1) 34, the second sensing module (SENSE2) 46 senses the charge on the gate of the FET contained in the first switch module (SWITCH1) 14 to determine whether the FET is conducting. If the FET is conducting, then EN2 is logic LOW. However, once the second sensing module (SENSE2) 46 senses that the FET has turned OFF and is no longer conducting, then E2 is logic HIGH indicating that it is safe to turn the FET contained in the second switch module (SWITCH2) 18 ON.

The second logic module (LOGIC2) 48 is responsive to the input signal (INPUT) on line 20 and the second enable signal (EN2) from the second sensing module (SENSE2) 46 on line 52 and provides a second logic signal (L2) on line 54 to the second driver module (DRIVER2) 50. The second logic module (LOGIC2) 48 will enable L2 only when both inputs INPUT and EN2 are logic HIGHs, ensuring that the FET contained in the first switch module (SWITCH1) 14 is no longer conducting. The second driver module (DRIVER2) 50 is responsive to the second logic signal (L2) from the second logic module (LOGIC2) 48 and provides a second driver signal (D2) on line 56 to the second switch module (SWITCH2) 18. When D2 is logic HIGH, the FET contained in the second switch module (SWITCH2) is turned ON, pulling OUTPUT LOW.

Figure 6:
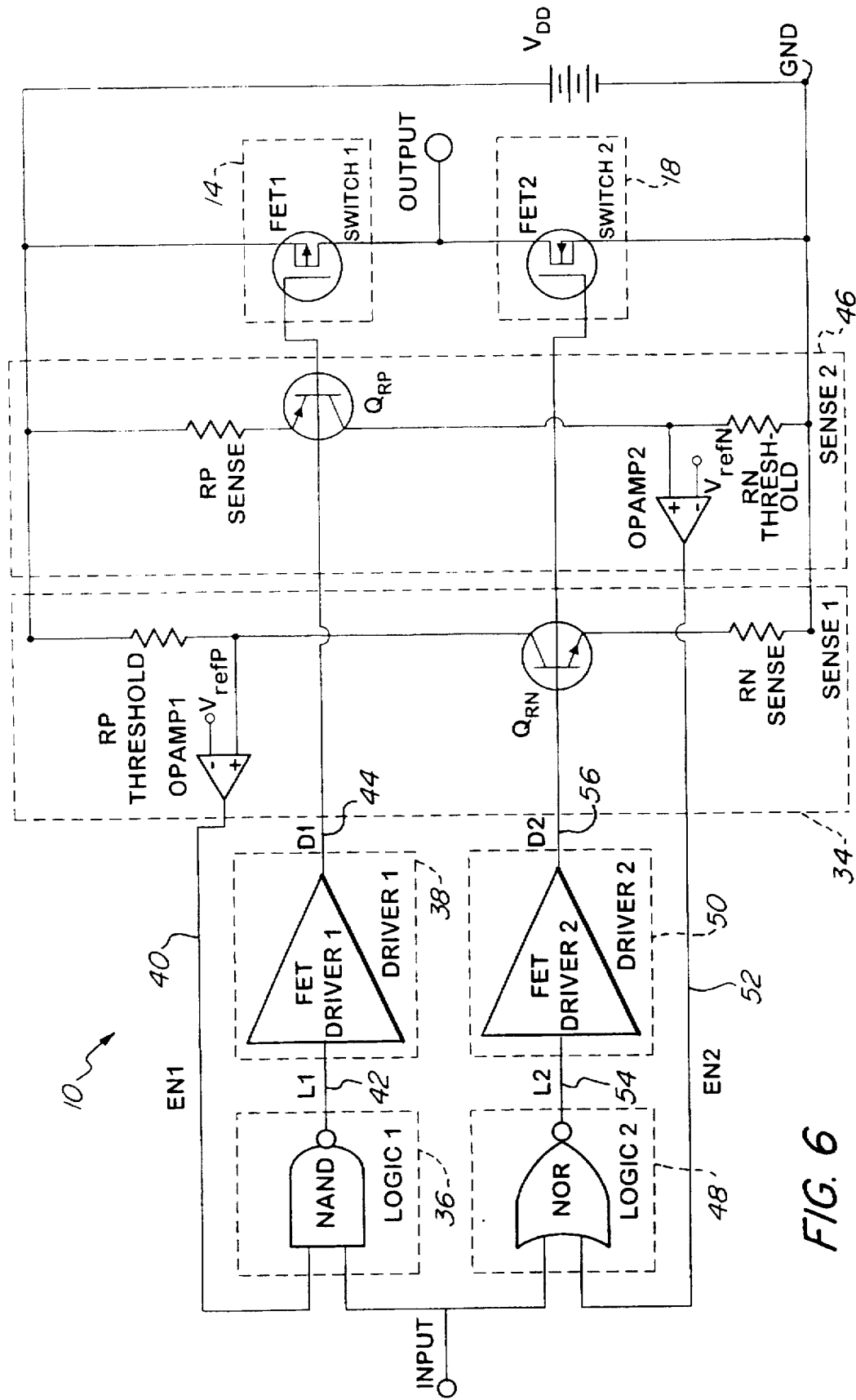
FIG. 6 is a simplified circuit diagram of a totem pole output stage according to the present invention.

FIG. 6 illustrates a simplified circuit implementation of the detailed block diagram shown in FIG. 5. As indicated by the dashed box 34, the first sensing module (SENSE1) includes a transistor $Q_{RN}$ connected in series with a resistor $RP_{threshold}$ and a resistor $RN_{sense}$ between voltage levels $V_{DD}$ and GND. The first sensing module (SENSE1) 34 also includes an operational amplifier (OPAMP1) having its noninverting input connected between $RP_{threshold}$ and the collector of $Q_{RN}$. A reference voltage $V_{refP}$ is applied to the inverting input of OPAMP1. The output of OPAMP1 is the first enable signal (EN1) on line 40.

The first logic module (LOGIC1) 36 includes a standard NAND gate responsive to logic inputs INPUT and EN1 for generating the first logic signal L1 on line 42.

The first driver module (DRIVER1) 38 includes a standard FET driver identified as FET DRIVER 1 which in response to the L1 signal, provides the first driver signal (D1) on line 44 for driving $Q_{RP}$.

The second sensing module (SENSE2) identified by the dashed box 46 includes a transistor $Q_{RP}$ connected in series with a resistor $RP_{sense}$ and a resistor $RN_{threshold}$ between voltage levels $V_{DD}$ and GND. The base of $Q_{RP}$ is connected to the output of FET DRIVER 1. In addition, the second sensing module (SENSE2) 46 includes an operational amplifier OPAMP2 whose noninverting input is connected between $RN_{threshold}$ and the collector of $Q_{RP}$. The inverting input of OPAMP2 is connected to a reference voltage $V_{refN}$. The output of OPAMP2 is the second enable signal (EN2) on line 52.

The second logic module (LOGIC2) 48 includes a NOR gate responsive to logic inputs INPUT and EN2 for generating the second logic signal (L2) on line 54.

The second driver module (DRIVER2) 50 includes a FET driver identified as FET DRIVER 2 which in response to the L2 signal, provides the second driver signal (D2) on line 56 for driving $Q_{RN}$.

The first switch module (SWITCH1) 14 includes a PFET identified as FET1 having its source connected to $V_{DD}$, its gate attached to the base of $Q_{RP}$ and the output of FET DRIVER 1, and its drain attached to the output signal (OUTPUT) 26. The second switch module (SWITCH2) 18 includes an NFET identified as FET2 and having its drain attached to the output signal (OUTPUT) 26, its gate attached to the base of $Q_{RN}$ and the output of FET DRIVER 2 and its source attached to GND.

GENERAL CIRCUIT OPERATION

The general operation of the circuit illustrated in FIG. 6 is based upon preventing both FET1 and FET2 from conducting simultaneously without the use of a fixed timing delay while maximizing switching performance. In general, this is accomplished by measuring the gate voltage ($V_{GS}$) of the opposing FET in the totem pole to ascertain when the opposing FET has been turned OFF and is no longer conducting. The resulting performance of the circuit is dependent only upon component performance and is therefore applicable to all uses of this totem pole driver, regardless of the application.

CIRCUIT OPERATION—STEADY STATE LOW

As illustrated in FIG. 6, when INPUT is a logic LOW, OUTPUT is also LOW (e.g., OUTPUT=GND), such that FET1 is not conducting while FET2 is conducting, and therefore $V_{GD}$ of FET1 and $V_{GS}$ of FET2 are both positive. A positive $V_{GD}$ on FET1 means that $Q_{RP}$ is conducting and that D1 and L1 are both logic HIGHs. Similarly, since $V_{GS}$ on FET2 is also positive, then $Q_{RN}$ is also conducting meaning D2 and L2 are also logic HIGHs. Since L2 is logic HIGH and INPUT is logic LOW, EN2 must also be logic LOW. Additionally, since $Q_{RN}$ is conducting, the voltage on the noninverting input of OPAMP1 is $V_{DD}-V_{RP}$, making EN1 logic LOW (where $V_{RP}$ is the voltage drop across $RP_{threshold}$).

CIRCUIT OPERATION—LOW TO HIGH TRANSITION

Ordinarily, while the circuit is in a steady state condition with a LOW OUTPUT, changing INPUT from a logic LOW to a logic HIGH would almost immediately change both L2 and D2 from a logic HIGH to a logic LOW, turning $Q_{RN}$ OFF. As $Q_{RN}$ stops conducting, the inverting input of OPAMP1 goes HIGH (because there is no voltage drop across $RP_{threshold}$), making EN1 a logic HIGH. With both EN1 and INPUT logic HIGHs, L1 and D1 become logic LOWs, turning FET1 ON almost immediately. However, the circuit arrangement of the present invention prevents FET1 from turning ON until FET2 turns OFF. The capacitance of FET2 prevents $Q_{RN}$ from turning off until $V_{GS}$ of FET1 decays to a level low enough for $Q_{RN}$ to turn OFF. Consequently, when D2 changes from a logic HIGH to a logic LOW, $Q_{RN}$ does not turn OFF immediately, but instead, continues to conduct until $V_{GS}$ of FET2 drops low enough to turn $Q_{RN}$ OFF. While $Q_{RN}$ continues to conduct, the input to the noninverting terminal of OPAMP1 remains low and consequently EN1 remains logic LOW. L1 and D1 remain logic LOW and FET1 is prevented from turning ON. Therefore, although INPUT has transitioned from a logic LOW to a logic HIGH, the circuit prevents a mutual conductivity event by not allowing FET1 to conduct until FET2 is no longer conducting. As will be understood by those skilled in the art, $Q_{RN}$, $RP_{threshold}$ and VrefP are selected such that EN1 does not transition from logic LOW to logic HIGH until FET2 is no longer conducting.

CIRCUIT OPERATION—STEADY STATE HIGH

In the high steady state condition with both the INPUT and OUTPUT signals high, FET1 and $Q_{RP}$ are both conducting while FET2 and $Q_{RN}$ are both not conducting. The noninverting input of OPAMP1 is pulled HIGH which makes EN1 a logic HIGH. Similarly, since $Q_{RP}$ is on, the noninverting input of OPAMP2 is high, making EN2 a logic HIGH.

CIRCUIT OPERATION—TRANSITION FROM HIGH TO LOW

Turning FET2 on is dependent on L2 and D2 transitioning from a logic LOW to a logic HIGH. Changing INPUT from a logic HIGH to a logic LOW immediately changes both L1 and D1 from logic LOW to logic HIGH. Although D1 is logic HIGH on the base of $Q_{RP}$, the capacitance of FET1 keeps $Q_{RP}$ conducting until the voltage on the gate of FET1 decays and FET1 turns OFF. Consequently, EN2 stays high, keeping L2 and D2 at logic LOWs and FET2 OFF. Once $Q_{RP}$ stops conducting, the noninverting input of OPAMP2 is pulled LOW, and therefore EN2 becomes logic LOW. Essentially, although INPUT has changed from a logic HIGH to a logic LOW, FET2 is held OFF until FET1 has stopped conducting.

As would be appreciated by one skilled in the art, $V_{refP}$ is selected based on the desired current through $RP_{threshold}$ so as to set the switch point for $Q_{RP}$. Similarly, $V_{refN}$ is selected based on the desired current through $RN_{threshold}$ so as to set the switch point for $Q_{RN}$.

Although the totem pole circuit of FIG. 6 is shown as being implemented with a PFET and an NFET, the design of the invention will work equally as well using two NFETs, two PFETs, two insulated gate bipolar transistors (IGBTs), or any other combination of these or other components which could be used as an output stage so long as the switching transistors have a measurable capacitance the magnitude of which is indicative of whether the transistor is conducting.

Utilizing typical curves for gate threshold versus drain current and gate threshold versus gate charge, the following equations at least partially define the circuit presented in FIG. 6:

$Q_G = I*T$, where $Q_G$ is the total charge on the gate $V_{GS} = Q_G/C_G$, where $C_G$ equals the total capacitance seen at the gate $VP_{sense} = (V_{GS}) - V_{be}$, where $V_{be}$ is the voltage drop of the base to emitter junction of the transistor (e.g., $Q_{RN}$ or $Q_{RP}$)

$I_{RP} = [(V_{GS}) - V_{BE}]/RP_{sense}$

The thresholds can be defined as a product of the available charge on the opposing gate. Since the threshold voltage is defined by a reference voltage, the threshold resistor can now be determined by the following equation:

$$RN_{threshold} = V_{refN}/[(V_{GS}) - V_{BE}]RP_{sense}$$

$$RN_{threshold} = V_{refN} * RP_{sense}/(VP_{GS} - V_{BE})$$

The result is an equation which does not have a "T" term and is therefore time independent. The response of this circuit is independent of switching rate resulting in a switch speed which is only limited by component performance.

Figure 7:
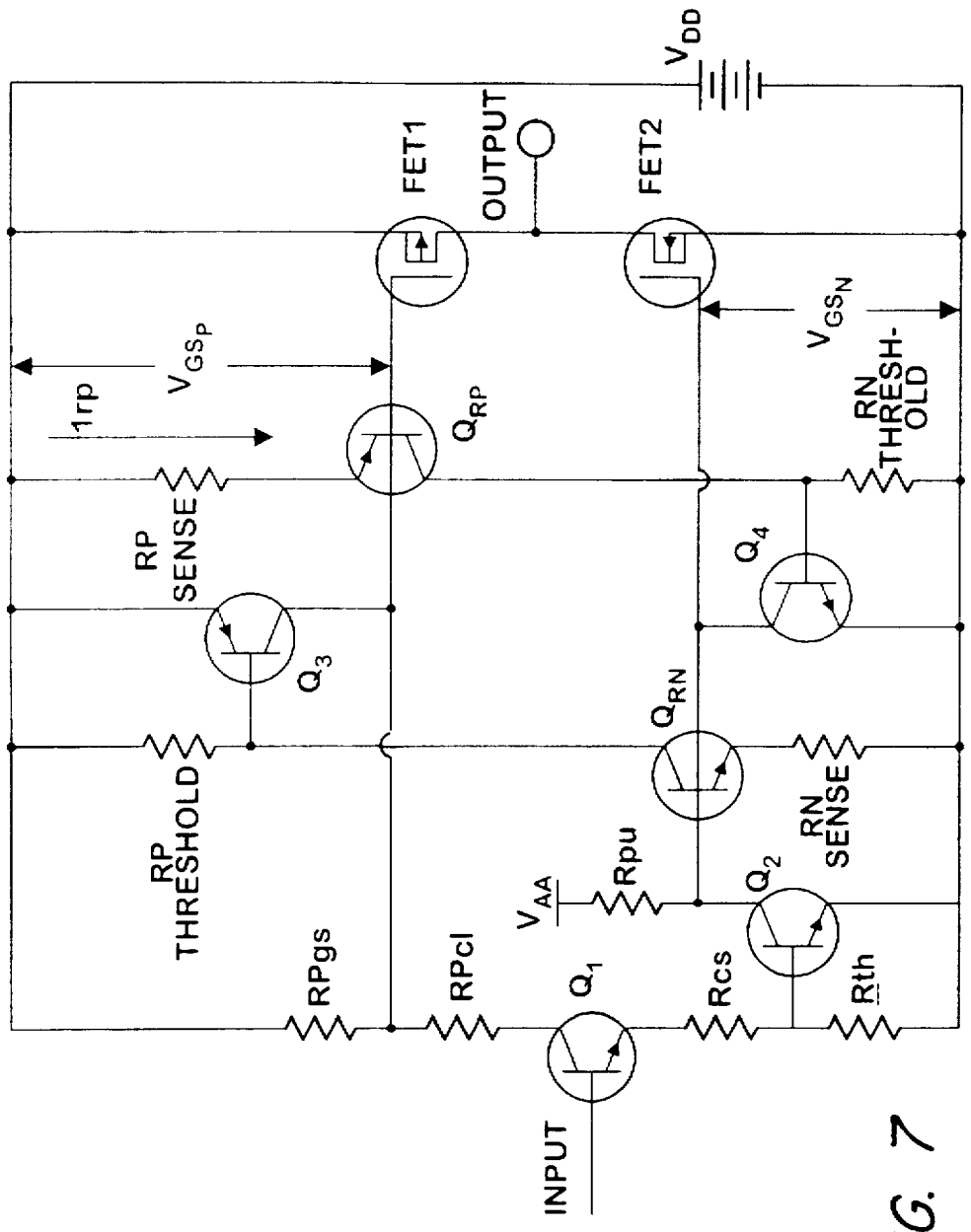
FIG. 7 is a detailed circuit diagram of the simplified circuit diagram of FIG. 6.

The circuit illustrated in FIG. 7 is a practical and simple application of the present invention. A signal which operates between 0.4 volts and 4.5 volts is used to actuate the drive circuitry. LOGIC1 36, DRIVER1 38, LOGIC2 48 and DRIVER2 50 of FIG. 6 have been implemented in the circuit of FIG. 7 with two transistors $Q_1$ and $Q_2$ and several resistors. Specifically, $Q_1$ is arranged in series between resistors $RP_{gs}$ and $RP_{ct}$, and resistors $R_{cs}$ and $R_{th}$ between $V_{DD}$ and GND. The base of $Q_1$ is connected to INPUT. $Q_2$ is arranged in series with $R_{pu}$ between $V_{AA}$ and GND, the base of $Q_2$ being connected between $R_{cs}$ and $R_{th}$. In addition, OPAMP1 and OPAMP2 have been implemented with transistors $Q_3$ and $Q_4$ respectively.

This circuit implementation provides relatively slow transitions of gate voltage (on the order of 2.5 microseconds per time constant).

In one implementation of FIG. 7, $RP_{gs}$, $RP_{ct}$, Rh and $R_{pu}$ are 2K$\Omega$ resistors and $R_{cs}$ is a 909$\Omega$ resistor. The $V_{GS}$ OFF state voltage of both the highside switch (FET1) and the lowside switch (FET2) are assumed to be the same (since each control circuit is independent, this assumption is not required for all circuit implementations).

Using the above equations:

$$I_{rp} = [(V_{GS}) - V_{BE}]/RP_{sense}$$

and $$RN_{threshold} = V_{refN} * RP_{sense}/(VP_{GS} - V_{BE})$$

The value of $RP_{sense}$ can be arbitrarily assigned, e.g., 2 k$\Omega$. Vbe is assumed to 0.85 volts, and therefore:

$$Irp = [(V_{GS}) - V_{BE}]/RP_{sense}$$
$$= [2 \text{ volts} - .85 \text{ volts}]/2 \text{ k ohms}$$
$$= .575 \text{ milliamps}$$

since $$RN_{threshold} = V_{refN} * RP_{sense}/(VP_{GS} - V_{BE})$$

then $$RN_{threshold} = V_{refN}/I_{rp}$$

and with $V_{ref}$ equal to $V_{BE}$ then:

$$RN_{threshold} = (V_{refN} = V_{BE})/I_{rp}$$
$$= (.85 \text{ volts})/(.575 \text{ milliamps})$$
$$= 1.478 \text{ k ohms or approximately } 1.5 \text{ k ohms}$$

Alternatively, a value of $RN_{threshold}$ could be arbitrarily assigned and the value of $RP_{sense}$ can be determined using the above equations.

The logic HIGHs and LOWs and specific components discussed herein are used as examples only. As would be appreciated by one skilled in the art, other circuit implementations and logic levels could be used to implement the totem pole output driver of the present invention so long as the totem pole devices are controlled in response to a change in the input signal in a manner which prevents mutual conductivity of the devices by not turning the device which is OFF to ON until the device which is currently conducting has been turned OFF and is no longer conducting.

As will be appreciated from the description provided herein, the present invention provides a totem pole output stage device which prevents mutual conductivity events without the use of a timing delay. Although the present invention has been described and discussed herein with respect to at least one embodiment, other arrangements or configurations may also be used that do not depart from the spirit and scope hereof.

What is claimed is:

1. A switching stage for switching an output signal (OUTPUT) between a first voltage level and a second voltage level in response to an input signal (INPUT), said switching stage comprising:

a. first switch means (SWITCH1), responsive to a first control signal (CTRL1) for switching the output signal (OUTPUT) to the first voltage level and for providing a first switch status signal (SW1), indicative of the conductive state of said first switch means (SWITCH1);

b. second switch means (SWITCH2), responsive to a second control signal (CTRL2) for switching the output signal (OUTPUT) to the second voltage level and for providing a second switch status signal (SW2), indicative of the conductive state of said second switch means (SWITCH2).

c. first control means (CONTROL1), responsive to the input signal (INPUT) and the second switch status signal (SW2), for providing the first control signal (CTRL1); and d. second control means (CONTROL2), responsive to the input signal (INPUT) and the first switch status signal (SW1) for providing the second control signal (CTRL2).

whereby the output signal (OUTPUT) is switched to either the first or second voltage level in response to the input signal (INPUT), but not both voltage levels simultaneously, and wherein the output signal (OUTPUT) is switched to the first voltage level only when said second switch status signal (SW2) indicates that said second switch means (SWITCH2) is not conducting and wherein the output signal (OUTPUT) is switched to the second voltage level only when said first switch status signal (SW1) indicates that said first switch means (SWITCH1) is not conducting; and wherein said first switch means (SWITCH1) includes a PFET type field effect transistor (FET) and wherein said second switch means (SWITCH2) includes an NFET type field effect transistor (FET) and wherein said first and second switch means (SWITCH1, SWITCH2) are arranged in series between the first and second voltage levels and the output signal (OUTPUT) signal is connected to the drains of the PFET and NFET type field effect transistors (FETs); and wherein said first control means (CONTROL) comprises, first sensing means (SENSE1), responsive to the second switch status signal (SW2) for providing a first enable signal (EN1), first logic means (LOGIC1), responsive to the input signal (INPUT) and the first enable signal (EN1) signal, for providing a first logic signal (L1), and first driving means (DRIVER1), responsive to the first logic signal (L1) for providing the first control signal (CTRL1) and wherein said second control means (CONTROL2) comprises, second sensing means (SENSE2), responsive to the first switch status signal (SW1) for providing a second enable signal (EN2).

second logic means (LOGIC2), responsive to the input signal (INPUT) and the first enable signal (EN1) for providing a second logic signal (L2), and second driving means (DRIVER1), responsive to the second logic signal (L2) for providing the second control signal (CTRL2); and wherein said first logic means (LOGIC1) comprises a NAND gate and wherein said second logic means (LOGIC2) comprises a NOR gate; and wherein said first sensing means (SENSE1) comprises a first operational amplifier (OPAMP1), a first resistor ($RP_{threshold}$), a second resistor ($RN_{sense}$) and a first transistor ($Q_{RN}$) and wherein said second sensing means (SENSE2) comprises a second operational amplifier (OPAMP2), a resistor ($RP_{sense}$) and a fourth resistor ($RN_{threshold}$) and a second transistor ($Q_{RP}$).

2. The switching stage of claim 1, wherein said first resistor ($RP_{threshold}$), said first transistor ($Q_{RN}$) and said second resistor ($RN_{sense}$) are arranged in series between the first and second voltage levels such that said first resistor ($RP_{threshold}$) is connected between the first voltage level and the collector of said first transistor ($Q_{RN}$) and said second resistor ($RN_{sense}$) is connected between the second voltage level and the emitter of said first transistor ($Q_{RN}$) and wherein a noninverting input of said first operation amplifier (OPAMP1) is connected to the collector of said first transistor ($Q_{RN}$) and the base of said first transistor ($Q_{RN}$) is connected to said second switch means (SWITCH2).

3. The switching stage of claim 1, wherein said third resistor ($RP_{sense}$), said second transistor ($Q_{RP}$) and said fourth resistor ($RN_{threshold}$) are arranged in series between said first and second voltage levels such that said third resistor (RP$_{sense}$) is connected between the first voltage level and the collector of said second transistor (Q$_{RP}$) and said fourth resistor (RN$_{threshold}$) is connected between the second voltage level and the emitter of said second transistor (Q$_{RP}$) and wherein a noninverting input of OPAMP2 is connected to the emitter of said second transistor (Q$_{RP}$) and said first switch means (SWITCH1) comprises a PFET and the base of said second transistor (Q$_{RP}$) is connected to the gate of said PFET.

4. The switching stage of claim 1, wherein said first operational amplifier (OPAMP1) comprises a third transistor (Q3) and wherein said second operational amplifier (OPAMP2) comprises a fourth transistor (Q4).

5. A switching stage for switching an output (OUTPUT) signal between first and second voltage levels in response to an input signal (INPUT), said switching stage comprising:

a. first and second switching devices arranged in a totem pole configuration between the first and second voltage levels, said first switching device being responsive to a first control signal (CTRL1), said second switching device being responsive to a second control signal (CTRL2);

b. first control means (CONTROL1) coupled to said first and second switching devices, said first control means (CONTROL1) being responsive to the input signal (INPUT) and a conductive state of said second switching device for providing said first control signal (CTRL1) for selecting either a conductive or nonconductive state of said first switching device; and c. second control means (CONTROL2) coupled to said first and second switching devices, said second control means (CONTROL2) being responsive to the input signal (INPUT) and the conductive state of said first switching device for providing said second control signal (CTRL2) for selecting either a conductive or nonconductive state of said second switching device, such that said switching stage operates so as to prevent said first and second switching devices from conducting simultaneously while minimizing the switching time of said switching stage, and wherein the output signal (OUTPUT) is switched to the first voltage level only when said second switching device is not conducting and wherein the output signal (OUTPUT) is switched to the second voltage level only when said first switching device is not conducting, and wherein said first and second switching devices provide first and second switch status signals (SW1, SW2) respectively indicative of the conductive state thereof, and wherein said first control means (CONTROL1) comprises, first sensing means (SENSE1), responsive to the second switch status signal (SW2) for providing a first enable signal (EN1), first logic means (LOGIC1), responsive to the input signal (INPUT) and the first enable signal (EN1) for providing a first logic signal (L1), and first driving means (DRIVER1), responsive to the first logic signal (L1) for providing the first control signal (CTRL1), and wherein said second control means (CONTROL2) comprises, second sensing means (SENSE2), responsive to the first switch status signal (SW1) for providing a second enable signal (EN2), second logic means (LOGIC2), responsive to the input signal (INPUT) and the first enable signal (EN1) for providing a second logic signal (L2), and second driving means (DRIVER1), responsive to the second logic signal (L2) signal for providing the second control signal (CTRL2), and wherein said first logic means (LOGIC1) comprises a NAND gate and wherein said second logic means (LOGIC2) comprises a NOR gate, and wherein said first sensing means (SENSE1) comprises a first operational amplifier (OPAMP1), a first resistor (RP$_{threshold}$), a second resistor (RN$_{sense}$) and a first transistor (Q$_{RN}$) and wherein said second sensing means (SENSE2) comprises a second operational amplifier (OPAMP2), a third resistor (RP$_{sense}$) and a fourth resistor (RN$_{threshold}$) and a second transistor (Q$_{RP}$).

6. The switching stage of claim 5, wherein said first resistor (RP$_{threshold}$), said first transistor (Q$_{RN}$) and said second resistor (RN$_{sense}$) are arranged in series between the first and second voltage levels such that said first resistor (RP$_{threshold}$) is connected between the first voltage level and the collector of said first transistor (Q$_{RN}$) and said second resistor (RN$_{sense}$) is connected between the second voltage level and the emitter of said first transistor (Q$_{RN}$) and wherein a noninverting input of said first operational amplifier (OPAMP1) is connected to the collector of said first transistor (Q$_{RN}$) and wherein said second switching device includes an NFET and the base of said first transistor (Q$_{RN}$) is connected to the gate of said NFET.

7. The switching stage of claim 5, wherein said second resistor (RP$_{sense}$), said second transistor (Q$_{RP}$) and said first resistor (RN$_{threshold}$) are arranged in series between said first and second voltage levels such that said third resistor (RP$_{sense}$) is connected between the first voltage level and the collector of said second transistor (Q$_{RP}$) and said first resistor (RN$_{threshold}$) is connected between the second voltage level and the emitter of said second transistor (Q$_{RP}$) and wherein a noninverting input of OPAMP2 is connected to the emitter of said second transistor (Q$_{RP}$) and said first switching device comprises a PFET and the base of said second transistor (Q$_{RP}$) is connected to the gate of said PFET.

8. The switching stage of claim 5, wherein said first operational amplifier (OPAMP1) comprises a third transistor (Q3) and wherein said second operational amplifier (OPAMP2) comprises a fourth transistor (Q4).

* * * * *

UNITED STATES PATENT AND TRADEMARK OFFICE
CERTIFICATE OF CORRECTION

PATENT NO. : 5,777,496
DATED : July 7, 1998
INVENTOR(S) : Jerard I. Herman

It is certified that error appears in the above-identified patent and that said Letters Patent is hereby corrected as shown below:

In Column 5, line 26: "FET1" should be --FET2--.

In Column 8, line 21: "CONTROL" should be --CONTROL1--.

In Column 8, line 50: Before "resistor" insert --third--.

Signed and Sealed this

Fifteenth Day of September, 1998

Attest:

BRUCE LEHMAN

*Attesting Officer*  *Commissioner of Patents and Trademarks*